United States Patent [19]
Johnston et al.

[11] Patent Number: 5,353,029
[45] Date of Patent: Oct. 4, 1994

[54] SEPARABLE ELECTROMAGNETIC WAVEGUIDE ATTENUATOR

[76] Inventors: Beverly R. Johnston; Everill E. Johnston, both of P.O. Box 1393, Sierra Vista, Ariz. 85635

[21] Appl. No.: 63,892
[22] Filed: May 17, 1993
[51] Int. Cl.$^5$ ............................................. H01Q 17/00
[52] U.S. Cl. ............................................. 342/4; 342/1
[58] Field of Search ............................................. 342/1, 4

[56] References Cited
U.S. PATENT DOCUMENTS

| | | | |
|---|---|---|---|
| 5,057,842 | 10/1991 | Möller et al. | 342/4 |
| 5,083,127 | 1/1992 | Frye et al. | 342/1 |
| 5,084,705 | 1/1992 | Frye et al. | 342/1 |
| 5,134,405 | 7/1992 | Ishihara et al. | 342/1 |

*Primary Examiner*—John B. Sotomayor

[57] ABSTRACT

A door assembly system for a shielding enclosure capable of attenuating RFI and EMI emissions, comprising of a separable waveguide attenuator structure assembly with triple track rails and channels for the disposition of electromagnets separately wound and energized, peripherally formed around the door casing member, inwhich is engaged with a door leaf member when in a closed position. Electromagnets are operatively connected and directly wired without the need for electronic filtering devices to the electronic control box unit located inside enclosure. Exterior door leaf sheet and trim are welded or preferably removable enabling the addition of security components and replacement of parts. A automatic door closure device pulls the door leaf members into close proximity to the pole faces of waveguide structure, which engages a switch to activate the electromagnets. The magnetic fields attracts and compresses the door leaf structure to the ferro-magnetic pole faces of the waveguide thusly completing the closed separable waveguide attenuator structure, additionally producing magnetic and electrical fields which merges RFI and EMI radiation into it's flux fields thusly attributing to attenuation of emissions. Electrical door switches are disposed of on both sides of shielding enclosure and are directly wired to the electronic control box inside enclosure for de-activating electromagnets by the immediate activation of a predetermined reversible disengaging current sent through electromagnet which allows for ingress or egress of personal through enclosure.

9 Claims, 6 Drawing Sheets

SEPARABLE ELECTROMAGNETIC WAVEGUIDE ATTENUATOR

TECHNICAL FIELD

This invention relates to shielding enclosures utilized to attenuate RFI/EMI emissions, particularly to a new concept of techniques to advance design solutions for door assemblies to significantly eliminate Radio Frequency Interference and Electromagnetic Interferences from penetrating into or out of a shielding enclosure.

BACKGROUND OF THE INVENTION

A. Field of the Invention

The increase use of electronic equipment and communications has stimulated the necessity for shielding enclosures utilized in anechoic chambers, communication facilities, test units, securement-of-conference rooms, portable communications, MRI, Tempest, Computer and HEMP facilities utilized by government agencies, private business sector and the medical field. Each enclosure requires an opening for exit and entrance, resulting in a need for a system to protect against emissions resulting from Radio Frequency Interference and Electromagnetic Interferences. The most vulnerable and used part is the door assembly, in that it is the most critical component of the shielding enclosure constantly ensuring attenuation. All shielded enclosures are required to meet Standards set forth in Shielding Effectiveness Specifications in regards to attenuated values of RFI/EMI Radiation emissions into or out of enclosure or system.

B. Description of the Prior Art.

A major problem facing the State-of-the-Art shielding enclosure door assemblies is their inability to meet the attenuated RFI/EMI emission values established within industry standard specifications and to provide continual performance levels without constant maintenance on fragile contact surfaces. Shielding enclosure door systems have numerous disadvantages such as; the hinderance of cumbersome heavy door leaf weights, dangerous automated door closure mechanical devices, lacks operational safety for quick egress, continual maintenance requirements for cleaning and replacement of contact interfaces such as pneumatic bladders and finger stock. For example; flexible conductive finger stock mounted into door casing, engages door leaf knife edge when in the closed mode, show extreme susceptibility to contaminants directly attributes to lower shielding effectiveness, thus high cleaning maintenance is required and the fragile finger stock is very susceptible to breakage resulting in replacement and significant shielding loss. Another magnetic seal application was the hybrid approach of combining permanent and electromagnets in attempt to increase magnetic field strength to seal door leaf to door casing assembly. Special difficulties are attributed to this type of system including but not limited to; control electronics, inadequate magnetic field strength, door leaf and casing contact surface/structure variables create structural misalignment and contact surface incongruities including such that any type of abrasion, nick or contaminants located in the contact seal area results in extreme shielding effectiveness loss and can result in total door replacement, electrical circuity for electromagnets are required to be enclosed within a sealed RF tight conduit and electronically filtered prior to entry into enclosure, the inability to control heat build-up within the door structure results in buckling of contact sheet preventing an efficacious seal, these and other characteristics lead to a system unable to meet reliability and industry shielding effectiveness performance standards. The use of permanent magnetic materials in the door assembly was an attempt to increase magnetic field strength and is essential to implement door opening, in both cases it is ineffective. This prior art application relies totally on the ability to provide an efficacious and gapless seal, with low electrical resistance at the contact interfaces, between door leaf and door casing, which is very difficult if not impossible to achieve on a continual basis, leaving this application impractical and ineffective in attenuating RFI/EMI emissions into or out of an enclosure.

OBJECTS AND SUMMARY OF THE INVENTION

Accordingly, object and advantages of the invention is to provide a novel door assembly for a shielding enclosure having a tightclosure unable to be opened while electromagnetic coils are energized, yet eliminating the need for accomplishing a gapless, faultless or efficacious seal at the contact surface areas while providing exceptional attenuation of EMI/RF leakage.

Another object of the invention is to provide closed channels in the ferro-magnetic waveguide structure eliminating electromagnetic flux line loss resulting in greater strength in the magnetic fields.

A still further object of the invention, the collation of the separable waveguide structure and energized electromagnets provide magnetic and electrical flux fields which in part absorbs and partially merges RFI and EMI waves into its flow instead of penetrating past door leaf contact areas.

Yet another object and advantage of the invention, provides a continuous operating coil system if either coil malfunctions because of the unique configuration of the waveguide structure which allows the magnetic fluxing fields to propagate into the channel proceeding the attenuation of leakage.

Several other objects and advantages are listed below:

a. to provide safe, quick emergency exiting with use of electrical door switches and in case of loss of power the door opens.

b. to provide a door assembly for high usage that is quick and easy for personnel to egress or ingress enclosure.

c. to provide a door leaf light in weight, attractive and choices of durable color finishes.

d. to provide compatible usage for a variety of different types of doors such as swing, double, pocket and slider doors.

e. to provide fewer mechanical parts and a low maintenance door without attenuation value loss.

f. to provide structural/electrical design to eliminate thermal build-up.

g. to provide a completely closed waveguide attenuator system which eliminates the need for electronic filtering devices from electromagnet wiring that is operatively connected to control box located inside enclosure.

h. to provide a separable wavguide assembly in which shielding effectiveness performance is not directly affected by scratches, nicks or contaminants in the interface surface areas between door leaf and door casing assemblies.

The most important object of this invention is its capability of surmounting the highest degree of all specifications required for RFI/EMI shielding enclosures, thus exceeding all prior state-of-the-art shielding door assemblies.

This invention is directed to a separable RF waveguide structure assembly to attenuate leakage of RFI/EMI emissions into or out of a shielding enclosure in the door assembly area between a door leaf member and its door casing member, in which is necessary to enable personnel to ingress or egress from a shielding enclosure. One embodiment of the invention is a separable waveguide attenuator composed of ferro-magnetic masses of different shapes and thicknesses peripherally formed around the door casing member, consisting of closed channel shapes, therein providing for disposition of electromagnets. A second embodiment of the invention are the electromagnets providing magnetic fields to engage closure of waveguide assembly and implements separation/opening of door leaf assembly from door casing. A third embodiment of the invention is the collation of the separable waveguide structure and the electromagnet which when energized produces magnetic and electrical flux fields that attribute to the attenuation of RFI/EMI emissions. A fourth embodiment of the invention is that the dual electromagnet system has a safety back-up feature, wherein if a malfunction of the primary electromagnet occurs the secondary electromagnet remains energized ensuring that no loss of attenuation occurs, in that the novel design of the separable waveguide structure allows the magnetic and electrical flux fields to propagate through the remaining ferro-magnetic waveguide structure, effectively proceeding to attenuate RFI/EMI emissions. A fifth embodiment of the invention is the door casing is designed with an adaptable flange plate of different sizes or other configurations dictated by existing structures to provide surfaces for tubular structure stability and for waveguide structure. The sixth embodiment of the invention is the exterior door leaf sheet and trim are welded or preferably removable for the addition of security components or when damage occurs requiring replacement of parts. The seventh embodiment of the invention are hand actuated electrical switches or other operative means to de-energize electromagnets for egress or ingress of the compartment. The eighth embodiment of the invention is the electromagnet wiring is passed through a small opening and operatively connected to the electrical control unit within the enclosure without the need for special electronic filtering devices and still complying with and exceeding industry standards for Shielding Effectiveness. The ninth embodiment of the invention is that the separable waveguide attenuator is not reliant upon a faultless, gapless, minimal transitional electrical resistance or efficacious seal in order to provide superior attenuation of RFI/EMI emissions. The tenth embodiment of the invention is the residual flux densities combined with the electronically reversible disengaging circuit in which is operatively connected to electromagnets when activated implement separation of waveguide structure without mechanical means or the use of permanent magnets or other magnetic materials.

These and other objects and advantages will become apparent from a consideration of the ensuing description and drawings.

DESCRIPTION OF PREFERRED EMBODIMENTS

The door assembly is utilized in a shielding enclosure such as a room having a RFI/EMI shield formed by a number of different optional materials such as, non-magnetic metal foils/cloths or any ferrous/non-ferrous metals or any other means which can be electrically connected to the casing/frame members, by means such as the use of clamping devices, bolted interfaces or joined by any suitable welding process, thus the door or aperture assembly can provide similar or exceed desired shielding effectiveness characteristics associated with the base material used in the shielding enclosure. The door assembly is designed to provide a separable door assembly that effectively eliminates or substantially reduces EMI/RFI emissions into or out of the enclosure when the door is in a closed mode. The invention itself will best be understood by referring to the following descriptions and embodiments taken in conjunction with the accompanying drawings.

Figure 1:
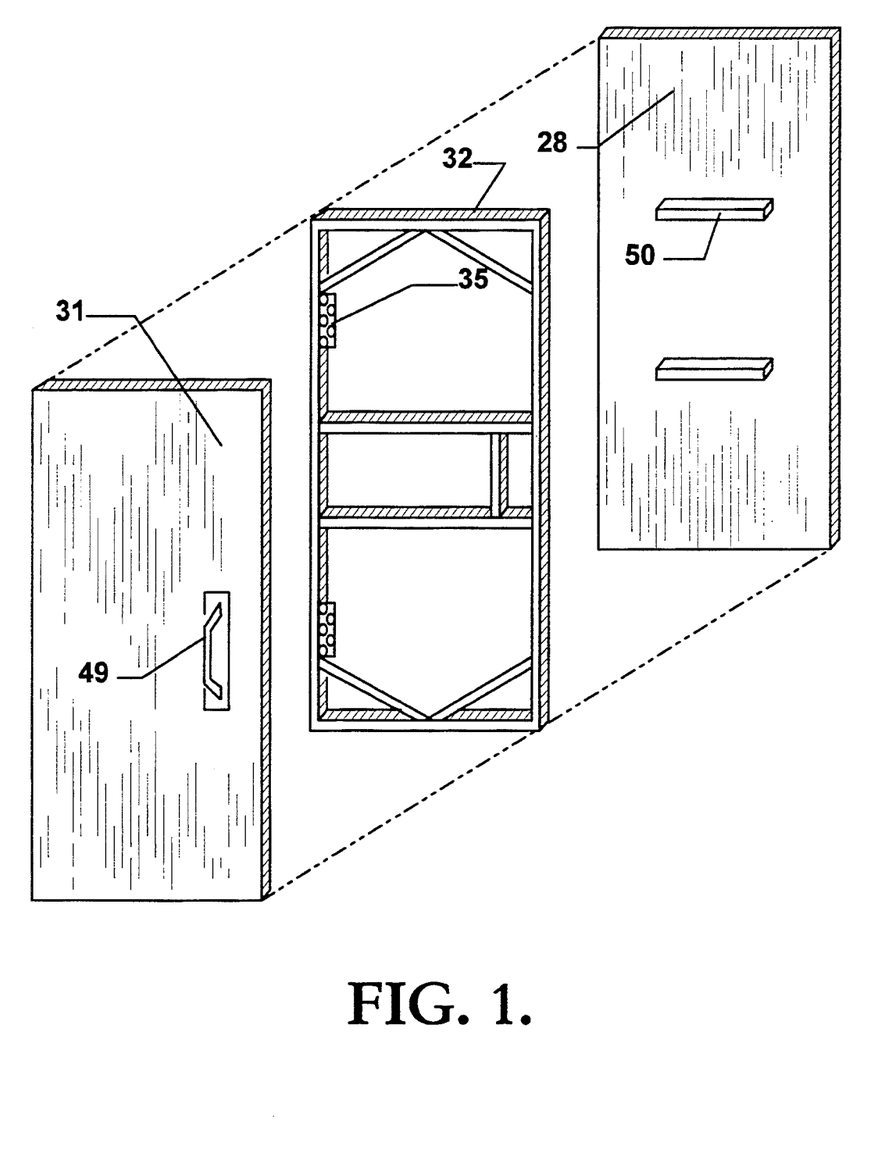
FIG. 1 is an isometric view of the door leaf assembly.

FIG. 1 illustrates a typical door leaf assembly 32 which provides a means of supporting the door leaf sheet 28, on which is mounted tubular members 50 that allow for a interface attachment to tubular frame members 32 by bolting, this in effect allows for freedom of movement within the door sheet 28 caused by induced thermal expansion from electromagnets 24 in some materials. Tubular members 32 are internally placed and connected from one to another, providing for necessary rigidity and structural stability allowing for any means of attachment by several different devices to allow for implementation in configurations such as standard swing, sliding, double door leafs, flush thresholds, etc., without size restrictions or intended use. The door leaf sheet 28, 31 can be fabricated of either a ferro-magnetic or non magnetic material such as ferrous and non ferrous metals and plastics plated with gold, silver, copper, etc., when coated plastics are used the door leaf sheet 28 is pulled into close proximity with waveguide structure 21, 22 by magnetically attracting internal tubular door leaf frame members 32. Door leaf sheet materials selections are dictated by the overall shielding effectiveness requirements of the shielding enclosure. Although the door leaf sheet 28, 31 as shown indicates that the entire sheet is fabricated in one piece, this does not exclude the fact that the door leaf sheet 28, 31 can be fabricated of several pieces and joined together by commercially available means.

Figure 2:
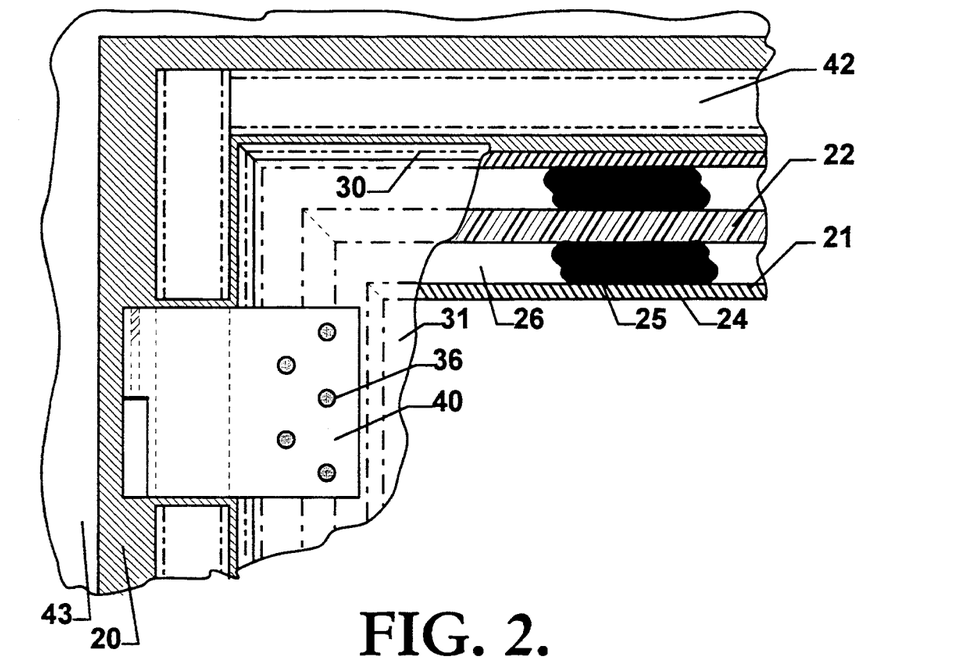
FIG. 2 ia a fragmentary elevation view, partial cutaway, of the corner of door frame and door leaf assembly.
Figure 3:
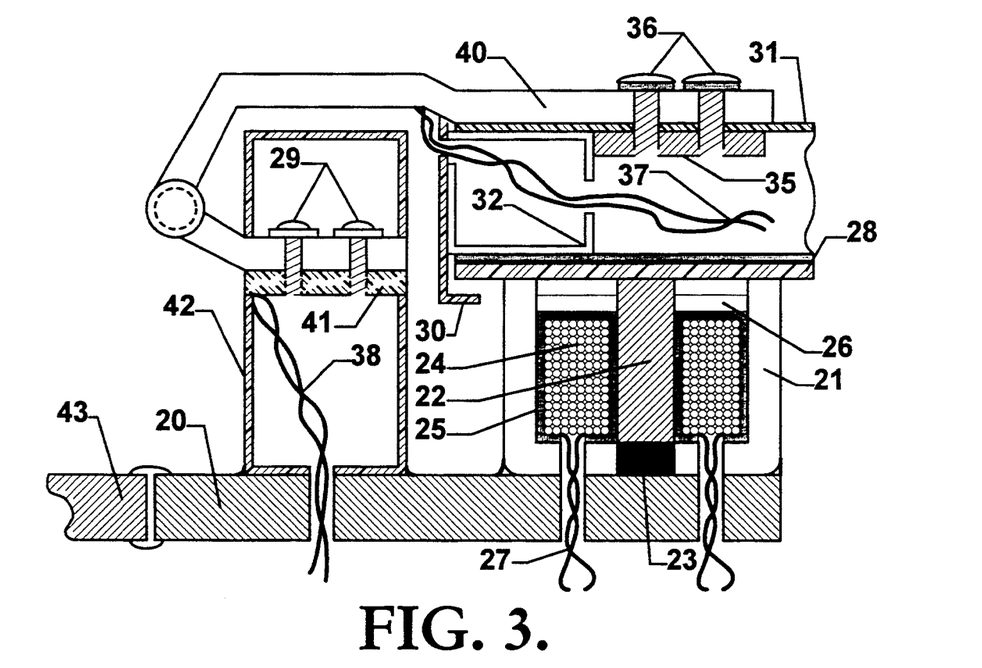
FIG. 3 is a cross-sectional view of the door frame, door leaf and specially constructed waveguide assembly.

FIGS. 2 and 3 illustrate the door casing assembly comprising of tubular shaped members 42 which are mounted to flange plate 20 by a suitable welding process, these members in their assembly forms a configuration or outline that generally corresponds to the door leaf assembly 28, 31, 32 and additionally provides stiffness throughout the casing assembly. The flange plate 20 acts as the interface to the shielding enclosure component 43 and is mounted by clamping assemblies, bolted structures or by a suitable welding process. The ferro-magnetic channel members 21, 22 with triple track pole faces provides a means of providing one part of the separable waveguide assembly, additionally providing a means of providing channels in-which electromagnets 24 are deposited, hereinafter more fully described in another embodiment of the invention. Tubular members 42 provide a means for securing hinges 40 by bolts 29 and allows for hinge adjustment in one direction by placing shim material between Hinge blocks 35, 41 and Hinge 40.

Figure 4:
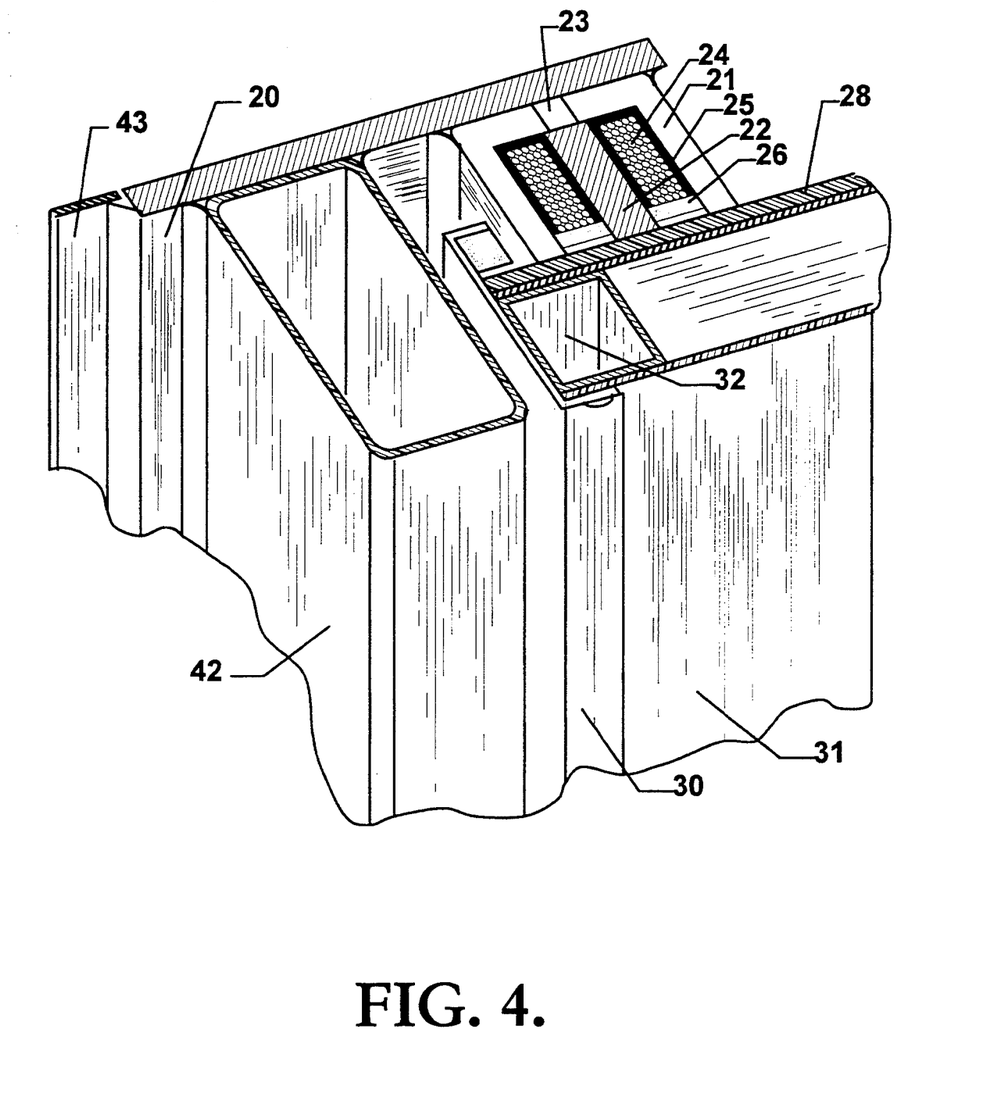
FIG. 4 is a fragmentary perspective view of specially constructed waveguide assembly and its associated interacting door leaf components of the invention by which a separable waveguide assembly is effected.

Referring now to FIG. 4, the separable ferro-magnetic waveguide assembly 21, 22, 28 is fabricated of a homogenous section of ferro-magnetic material, in which the center pole piece 22 is made of equal material type and the proportional surface area is greater than that of the outer disposed pole face surfaces 21. The center pole face 22 is mounted by conventional welding systems, by means of drilling through holes in said structure member 21 and plug welding 23 to center pole face 22, an alternate attachment means is by bolting center pole face 22 to ferro-magnetic member 21 or as an alternate means the entire assembly can be machined out of a solid piece. The ferro-magnetic waveguide structure provides a means for the retention of the electromagnet assembly 24 that includes a layer of di-electric and insulator material 25 inserted between electromagnet 24 and the ferro-magnetic structure 21, 22 providing heat transference and a dielectric between such items, also provides a means of heat transference away from electromagnet assembly, additionally a means of providing a durable interface between electromagnet 24 and said internal structure 21, 22 that prevents damaging said electromagnet 24 when installing into said channels. The electromagnet 24 is totally encased in said insulator/di-electric cocoon 25 in which a electrical epoxy compound 26 is placed on top of said assembly after being disposed of in said channels formed by ferro-magnetic waveguide structure, said epoxy 26 provides a means to seal the said electromagnet assemblies 24 that provides an environmental barrier, a means preventing decay, also a means of holding said assemblies in place without additional restraints and can easily be removed to allow for replacement of electromagnet.

In an embodiment of the invention, in providing a clamping closure force, the electromagnets 24 are energized to pull the door leaf sheet 28 into close proximity to the associated rail pole faces 21, 22, in performing this action the separable waveguide assembly is formed, which in test results provides at least or more than 120 db (decibel) attenuation in the frequency range of 50 Mhz thru 10 Ghz in the plane wave fields and is done so without any electronic filtering devices connected to the electromagnet wiring. A hole/holes are provided in the flange plate 20 for passage of the electromagnet wiring 27 into the physical extent of the shielding enclosure 43, however, it is to be noted that such wiring that extends within the enclosure to the electronic circuity control panel does not require any electronic filtering as does prior art assemblies, thus reducing overall cost significantly. The establishment of the waveguide is further verified through test results which exhibited attenuate values of over 100 db thur the plane wave fields mentioned above, only accomplishable by a waveguide beyond cut off, when a dielectric was placed in between the pole rail faces and the inner door leaf sheet, thereby breaking any electrical connection, establishing a dielectric and a prevailing open gap over 11 inches in length. The test results conclusively indicate that a gapless, faultless seal and electrical connection between the mating surfaces is not necessary for this waveguide assembly to attenuate RFI/EMI leakage. The triple track rail structure with varying sizes, thicknesses, orientation and magnetic field strengths provide for the means necessary for a waveguide assembly of this type.

In another embodiment, to separate effectively said waveguide assemble or to open said door, a means such as a switch (not illustrated) which are commercially available that are electrically initiated or by the means of Fiber Optic circuitry, in which both cases are disposed on the outside and inside of said shielded enclosure 43, a hole is provided through the flange plate 20 to provide wiring access into the enclosure 43, when fiber optic switching is used, being that it does not carry EMI/RFI along it's fiber, no electronic filtering devices are required for the penetration, thereby lower the cost of installation. The switch/switches when activated sends a signal to the electronic circuity within the door control panel located usually inside the enclosure, by activating said switches it provides a means of de-energize of electromagnetic and provides a predetermined measured electrical voltage flow in a reverse direction through the electromagnet circuit interacting upon the residual polarized magnetic flux densities within the separable waveguide structure 21, 22, 28, thus providing a means to effect a North-North or a South-South opposing magnetic polarization between the door leaf skin 28 and the triple rail faces 21, 22, which immediately pushes the two surfaces apart, thusly door opening cycle is accomplished without any mechanical imposed levers/mechanisms or permanent magnets.

Figure 5:
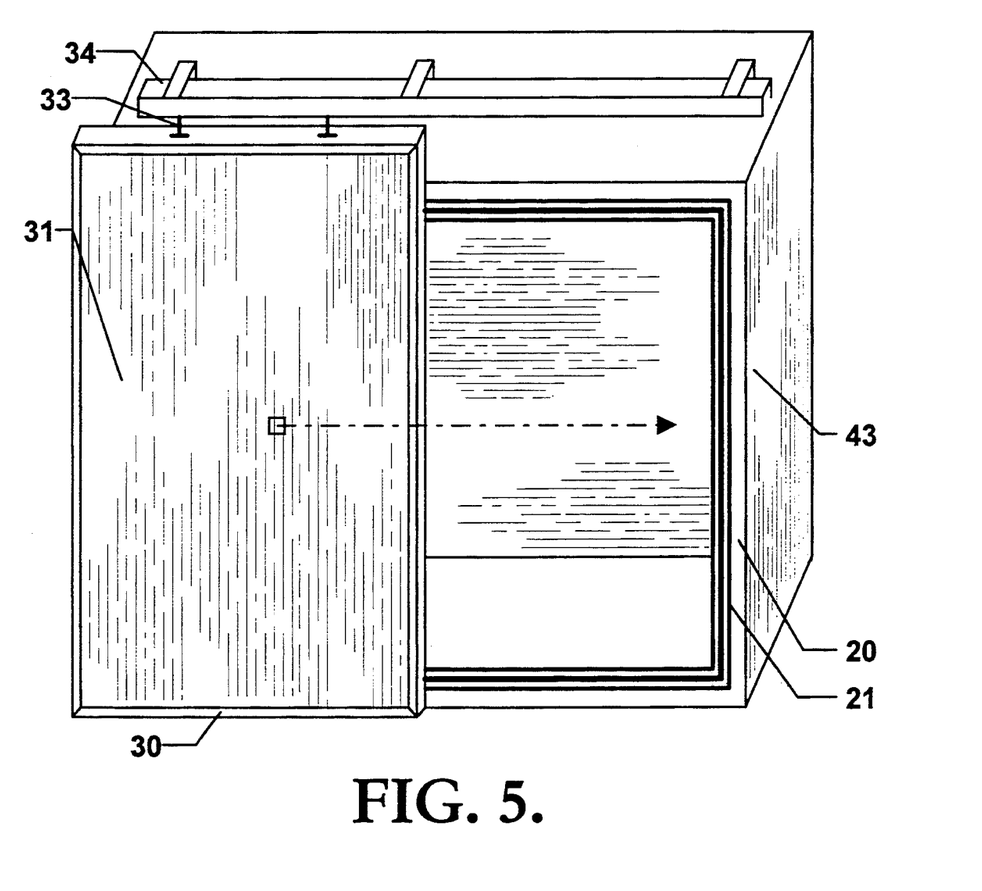
FIG. 5 is a perspective view of an alternate embodiment of the invention by which the door leaf assembly slides across the face of said ferro-magnetic waveguide structure, in an open mode.

FIG. 5 illustrates another embodiment of the invention, wherein a sliding door leaf assemble 31 is adapted and mounted by said means of which an adjustable U-shaped rail segment 34 is attached to the enclosure 43 above said door leaf 31, the door leaf assembly 31 is suspended from a U-shaped rail 34, via a wheel glide assembly 33 that allows for movement within the rail segment 34 and provides for a means of moving the door leaf assembly 31 to and from a frontal position to the enclosure 43, the U-shaped rail 34 and wheel glide assembly 33 are commercially available and are not shown. A means such as a switch, for the activation of the waveguide electromagnets 24 will be located in trim members on the outer area of the door casing opening, or optionally located within the door leaf assembly 31. The door activation cycle is the same as previously described above embodiments.

Figure 6:
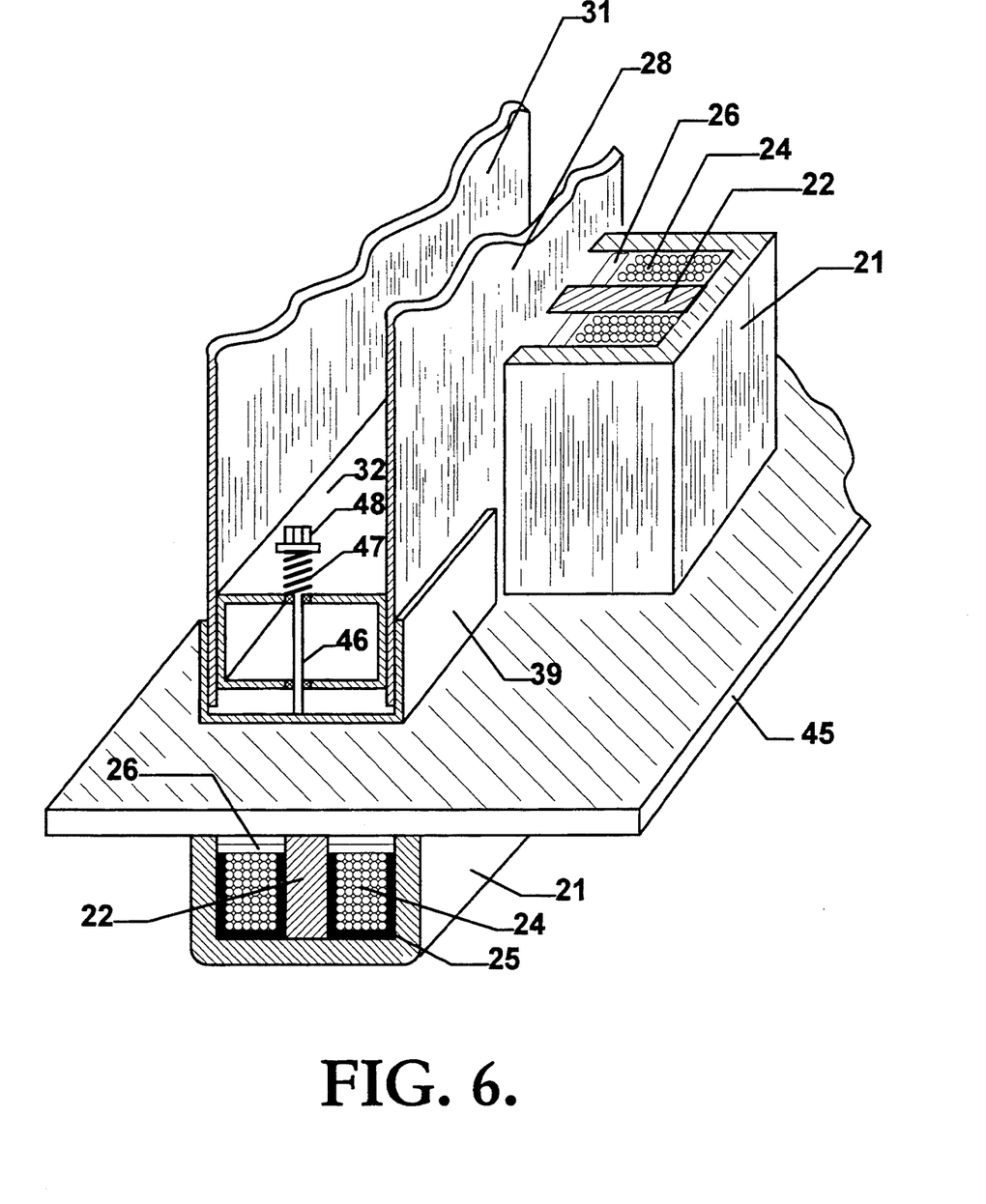
FIG. 6 is a cutaway view of an alternate embodiment which shows the adaptation of the threshold to lower said threshold to a height in which the structure will comply with handicap regulations.

FIG. 6 illustrates an alternative means to incorporate a flush threshold 45, that allows for full compliance with Government handicapped accessibility requirements. Threshold plate 45 is mounted to the retro-magnetic waveguide assembly 21, 22, under said plate 45 is mounted an independent electromagnet coil segment 24 which provides a means of inducing a magnetic field of sufficient strength that propagates through the non-ferrous material used in threshold plate 45, the magnetic field attracts to the floating waveguide structure 39, thereby compressing and bringing into close proximity with the threshold plate 45, substantially eliminating EMI/RFI leakage into or out of said shielding enclosure 43. The electronic and mechanical door open and closure cycle is the same as mentioned previously.

Figure 7:
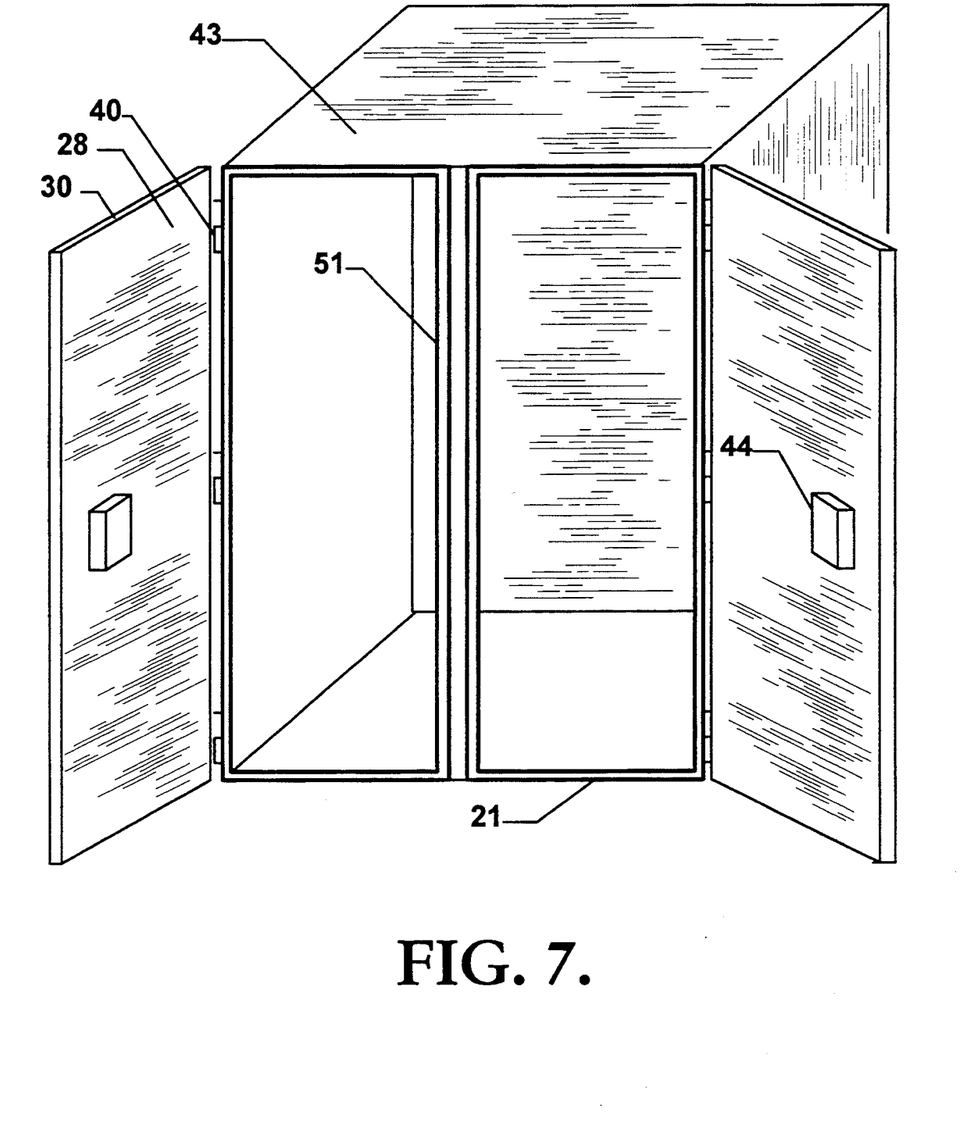
FIG. 7 is a perspective view of an alternate embodiment of a double door leaf configuration with an optional removable center mullion, in an open mode.

FIG. 7 illustrates another alternate embodiment of the invention, wherein two door leaf assemblies 28 are disposed of in the frame assembly 21, which consists of a removable mullion 51, also a means of attaching center mullion 51 to an inactive leaf. The center mullion 51 which consists in part of the ferromagnetic waveguide assembly 21, 22 in that it is disposed typically in the center of the peripheral waveguide assembly for providing a means to use two separate door leafs 28 within the same opening. Center waveguide assembly 51 is mounted to other waveguides 21, 22 or door leafs 28 by the use of bolts or quick disconnect fasteners. The electronic and mechanical door open and closer cycle is the same as mentioned above.

Another embodiment of the invention wherein the inner and outer door leaf sheets 28, 31 are substituted with dielectric sheets and are coated with any electrically conductive/RF reflective coatings or as another alternative the inner door leaf sheet material can be aluminum, copper or any non ferrous/non magnetic material that is also electrically conductive/RF reflective. The compression of the alternate inner door leaf sheet 28 to the waveguide pole face surfaces 21, 22 is accomplished when the electromagnets 24 are energized around the peripheral opening, providing a means of a induced magnetic field of sufficient strength that it propagates through the non ferris/non magnetic inner sheet 28, in turn attracts the tubular door leaf frame 32, thusly compressing the inner sheet 28 against the waveguide pole face surfaces 21, 22 completing the separable waveguide structure, thusly providing substantial reduction in door leaf weight while significantly reducing RFI/EMI leakage into or out of the enclosure 43. The electronic and mechanical door open cycle and closer cycle is the same as previously described.

Various changes and modifications may be made without varying from the scope and spirit of the invention. The different waveguide assemblies disclosed herein may be interchangeably employed with almost no size limitation with the various embodiments disclosed and they may be secured to any shielding enclosure so as to satisfy any configurations dictated by the enclosure specification.

While I have described above the principles of my invention in connection with specific apparatus it is to be clearly understood this description is made only by way of example and not as a limitation of my invention as set forth in the objects thereof and in the accompanying claims.

Thus the scope of the invention should be determined by the appended claims and their legal equivalents, rather than by the examples given.

I claim:

1. In a shielding enclosure such as a room which has a means to provide a reduction or elimination of radio-frequency wavelengths and electromagnetic emissions leakages into or out of said type assemblies having a casing member composed of portions arranged to define an access opening, members are mounted about said casing member that allows for movement between a first position closing the opening and a second position enabling access through the opening, through said opening it is sought to eliminate or substantially reduce leakage of radio-frequency wavelengths and electromagnetic emissions by an attenuator means across such openings while the door assembly is in the first position closed, said attenuator means comprising, a separable waveguide attenuator structure means peripherally mounted around said casing member depicting opening and a means to dispose electromagnets therein, attached thereof an electronic means including an electromagnet wiring circuit operatively connected to said electronic control box in which upon activation energizes said electromagnet therein coupling a ferro-magnetic sheet mounted to door leaf assembly in which the composition of said door leaf assembly, being members forming a flexible and twistable structure which spans across said opening, whereby when said door assembly is in the first position it forms said separable waveguide attenuator between said coupling means and thereby providing a means for eliminating the need to insure a shielding interface connection that is free of gaps, with minimum transitional electrical resistance or an efficacious sealing therebetween;

said coupling means comprising;

a ferro-magnetic waveguide structure and electromagnet disposed therein and coupled with pole faces of said structure and ferro-magnetic door leaf structure when said electromagnetic circuit is activated;

a means for reversibly disengaging of separable waveguide attenuator to allow movement of door leaf assembly to second position without assistance from mechanical devices or other magnetic material;

a means provided inwhich the electronic wiring of said electromagnet is adapted to be extended into said enclosure and therein be operatively connected to the electronic control box circuit that energizes and de-energizes said electromagnet without the need of electronic filtering devices or a sealed off pathway therebetween;

a means provided inwhich the electromagnet assumes a dual function by additionally attenuating RFI and EMI radiation by functioning as an electronic filtering device;

a means provided inwhich a dual electromagnet system provides the functional ability to maintain attenuation values by providing an independent secondary electromagnet, in that it continues to function as normal if the primary electromagnet fails operationally and additionally the ferro-magnetic structure ensures re-energization of malfunctioned electromagnet by the propagation of magnetic flux fields into said electromagnet.

2. A separable waveguide attenuator as recited in claim 1, in which said ferro-magnetic sheet is non-magnetic, electrically conductive and includes an interface of magnetically attractive elements backing said sheet thereto in a superimposed relationship with respect to said electromagnetic pole pieces.

3. A separable waveguide attenuator as recited in claim 1 wherein said retro-magnetic waveguide structure comprises a homogenous section without seams or welds, thereby creating an unrestricted path for electromagnet fluxing fields.

4. A separable waveguide attenuator as recited in claim 1, wherein said ferro-magnetic waveguide structure comprises continuous or segmented structures located about the peripheral opening of said enclosure, therein providing for diversification in sizes and shapes.

5. A separable waveguide attenuator as recited in claim 1, comprising an a actuating mechanism means disposed on the exterior face of said enclosure, thereof said mechanism provides for the activation of said electronic control circuit in that is operatively connected to said electromagnets, upon activation implements a reversible disengagement of said electromagnet flux densities within said waveguide structure.

6. A separable waveguide attenuator as recited in claim 5, wherein
   a hole provided in one of said enclosure walls by which connection of said actuating mechanism is adapted to be extended into said enclosure and there in be operatively connected to the electromagnetic circuit without the need of electronic filtering component devices or sealed off pathway there between, means comprises the utilization of fiber optic switches and cables as interfaces within said electronic control circuits.

7. A separable waveguide attenuator as recited in claim 1, further comprising an actuating mechanism is disposed on the interior face of said enclosure, there of said mechanism provides for the activation of electronic control circuit in that provides for the reversible disengagement of said electromagnet and said ferro-magnetic waveguide assembly.

8. A separably waveguide attenuator as recited in claim 1, wherein,
   a reversible disengaging electromagnetic control circuit means is operatively connected to said electromagnet wiring that provides a means when implemented to immediately open said waveguide structure to second position upon activation of said control circuit.

9. A separable waveguide attenuator as recited in claim 1, further including,
   a reversible disengaging electromagnetic control circuit includes a means for changing the magnetic forces clamping the door leaf members against the casing member to enable moving the door leaf assembly from first position to the second position, in that a means providing a predetermined reversible disengaging current sent through said electromagnet wiring from said electronic control circuit, thereby resulting in the immediate reversing of magnetic flux forces within the ferro-magnetic masses of said triple track waveguide structure inwhich immediately opposes the residual magnetic forces within said door leaf assembly that are unaffected by said reversing action contained within separate ferro-magnetic waveguide structure.

* * * * *